(12) United States Patent
Zhang et al.

(10) Patent No.: US 11,338,302 B1
(45) Date of Patent: May 24, 2022

(54) APPARATUS AND TEST METHOD FOR SIMULATING SPARK DISCHARGE OF HIGH-VOLTAGE ELECTROSTATIC PRECIPITATOR

(71) Applicants: Hubei University of Technology, Wuhan (CN); XIANGYANG JIUDING HAOTIAN EP EQUIPMENT CO., LTD., Xiangyang (CN)

(72) Inventors: Xiaoxing Zhang, Wuhan (CN); Rui Zhang, Xiangyang (CN); Qianjun Deng, Xiangyang (CN); Yinghao Guo, Xiangyang (CN); Shuo Jin, Wuhan (CN); Wenhao Han, Wuhan (CN); Tiezhou Wu, Wuhan (CN); Lan Xiong, Wuhan (CN)

(73) Assignees: Hubei University of Technology, Wuhan (CN); XIANGYANG JIUDING HAOTIAN EP EQUIPMENT CO., LTD., Xiangyang (CN)

(*) Notice: Subject to any disclaimer, the term of this patent is extended or adjusted under 35 U.S.C. 154(b) by 0 days.

(21) Appl. No.: 17/467,302

(22) Filed: Sep. 6, 2021

(30) Foreign Application Priority Data

Oct. 30, 2020 (CN) .......................... 202011188666.6

(51) Int. Cl.
*G01R 31/00* (2006.01)
*G01R 19/00* (2006.01)
(Continued)

(52) U.S. Cl.
CPC .................. *B03C 3/66* (2013.01); *G01R 1/00* (2013.01); *B03C 3/34* (2013.01); *B03C 3/41* (2013.01); *B03C 3/49* (2013.01); *H03K 3/00* (2013.01)

(58) Field of Classification Search
CPC combination set(s) only.
See application file for complete search history.

(56) References Cited

U.S. PATENT DOCUMENTS

| 1,992,113 A | * | 2/1935 | Anderson | B03C 3/41 |
| | | | | 96/88 |
| 2,696,572 A | * | 12/1954 | Schmid | H03K 3/43 |
| | | | | 377/103 |

(Continued)

FOREIGN PATENT DOCUMENTS

| DE | 3522568 A1 | * | 1/1987 | ............ B03C 3/68 |
| WO | WO-8807413 A1 | * | 10/1988 | ............ H02M 3/337 |

*Primary Examiner* — Christopher P Jones
*Assistant Examiner* — Sonji Turner
(74) *Attorney, Agent, or Firm* — Bayramoglu Law Offices LLC

(57) ABSTRACT

An apparatus and test method for simulating spark discharge of a high-voltage electrostatic precipitator are provided. The simulation apparatus includes a pulse power supply configured to provide a test voltage, an anode cylinder configured to simulate an anode of a precipitator, a cathode rod configured to simulate a cathode of the precipitator, a pulse capacitor unit configured to simulate an electrode capacitor of the precipitator, an insulating support configured to hang the cathode rod, a voltage divider configured to measure an electrode voltage, and a grounded current sampling unit configured to measure grounded current. The simulation apparatus simulates a discharge process of the high-voltage electrostatic precipitator to measure discharge characteristic parameters such as discharge current and discharge energy of the high-voltage electrostatic precipitator. In this way, characteristics of spark discharge of the precipitator under different load conditions are simulated.

15 Claims, 2 Drawing Sheets

(51) Int. Cl.
G01R 19/04 (2006.01)
B03C 3/66 (2006.01)
G01R 1/00 (2006.01)
B03C 3/34 (2006.01)
B03C 3/41 (2006.01)
B03C 3/49 (2006.01)
H03K 3/00 (2006.01)

(56) References Cited

U.S. PATENT DOCUMENTS

| | | | | |
|---|---|---|---|---|
| 2,948,849 A * | 8/1960 | Foster | ............... | G01R 15/14 324/551 |
| 2,962,609 A * | 11/1960 | MacDonald | ............ | H03K 3/37 307/132 E |
| 3,087,091 A * | 4/1963 | McFarland | ............ | H01T 2/02 315/241 R |
| 3,495,379 A * | 2/1970 | Hall | ............ | B03C 3/41 95/79 |
| 3,505,532 A * | 4/1970 | Steele | ............ | H03K 3/351 307/106 |
| 3,611,103 A * | 10/1971 | Ayers | ............ | H03K 3/55 219/113 |
| 3,818,248 A * | 6/1974 | Pittman | ............ | 327/493 |
| 3,836,852 A * | 9/1974 | Ross | ............ | G01R 27/02 324/123 R |
| 5,542,967 A * | 8/1996 | Ponizovsky | ............ | B01J 19/088 96/82 |
| 5,601,633 A * | 2/1997 | Ponizovsky | ............ | B01D 53/32 95/81 |
| 5,639,294 A * | 6/1997 | Ranstad | ............ | B03C 3/68 323/903 |
| 5,923,130 A * | 7/1999 | Roman | ............ | G01R 31/002 315/363 |
| 6,224,653 B1 * | 5/2001 | Shvedchikov | ............ | B01D 53/34 204/157.3 |
| 6,667,875 B1 * | 12/2003 | Hartmann | ............ | B03C 3/66 361/235 |
| 6,813,123 B2 * | 11/2004 | Pihl | ............ | H02H 7/003 361/20 |

* cited by examiner

APPARATUS AND TEST METHOD FOR SIMULATING SPARK DISCHARGE OF HIGH-VOLTAGE ELECTROSTATIC PRECIPITATOR

CROSS REFERENCE TO THE RELATED APPLICATIONS

This application is based upon and claims priority to Chinese Patent Application No. 202011188666.6, filed on Oct. 30, 2020, the entire contents of which are incorporated herein by reference.

TECHNICAL FIELD

The present invention relates to the field of spark discharge of electrostatic precipitators, and more particularly, to an apparatus and a test method for simulating spark discharge of a high-voltage electrostatic precipitator.

BACKGROUND

High-voltage electrostatic precipitation is a frequently-used precipitation method in factories, and has advantages such as high precipitation efficiency and low energy consumption. At present, most high-voltage electrostatic precipitators are excited by a direct current (DC) voltage superimposed with a narrow pulse, to improve their chargeability and precipitation efficiency. However, the excessively high voltage will break down an electric field between the cathode and the anode of the precipitator, thereby causing spark discharge. The spark discharge not only causes an instantaneous drop of the voltage, but also leads the precipitator to lose the precipitation effect, thereby affecting statuses of a precipitation power supply and other devices. When high-voltage electrostatic precipitation is performed for combustible gases such as coke oven gas, spark discharge can cause gas explosions and even serious safety accidents. Therefore, it is necessary to study characteristics of spark discharge of the high-voltage electrostatic precipitator to further improve the design of the precipitator and suppress possible spark discharge from the source when the precipitator works.

At present, the study of spark discharge of the high-voltage electrostatic precipitator mainly focuses on how to carry out intelligent control after spark discharge, to avoid re-discharge and reduce the sparking rate. However, limited by a test condition, there are only a few relevant characteristics of spark discharge of the precipitator now. Since the high-voltage electrostatic precipitator is bulky, if a relevant test is performed directly on the precipitator, there are many inconveniences in wiring and measurement, and it is difficult to obtain discharge signals of all positions during spark discharge, causing potential safety hazards.

SUMMARY

The present invention provides an apparatus and test method for simulating spark discharge of a high-voltage electrostatic precipitator, to resolve a problem that it is difficult to carry out a test and a relevant measurement when studying spark discharge of a high-voltage electrostatic precipitator.

According to one aspect of embodiments of the present invention, an apparatus for simulating spark discharge of a high-voltage electrostatic precipitator includes:

a pulse power supply, configured to provide a test voltage;

a voltage divider, configured to measure an electrode voltage;

a pulse capacitor unit, including a first pulse capacitor configured to simulate a precipitation tube on which spark discharge occurs in a precipitator, and a second pulse capacitor configured to simulate a capacitor of another precipitation tube connected in parallel to the precipitation tube on which spark discharge occurs;

a metal bar, transversely disposed on an insulating support;

a cathode rod, configured to simulate a cathode of the precipitator, where one end of the cathode rod is connected to the metal bar, and the other end of the cathode rod is placed in an anode cylinder configured to simulate an anode of the precipitator; and a grounded current sampling unit, configured to measure grounded current; where a high-voltage end of the pulse power supply, a high-voltage end of the voltage divider, a high-voltage end of the first pulse capacitor and a high-voltage end of the second pulse capacitor are successively connected, and then the high-voltage end of the second pulse capacitor is connected to the metal bar; a grounded end of the voltage divider is connected to a grounded end of the first pulse capacitor; a grounded end of the pulse power supply, the grounded end of the first pulse capacitor and the anode cylinder are connected to a grounded point of a test site through the grounded current sampling unit; and a grounded end of the second pulse capacitor is connected to the grounded point of the test site.

In some embodiments, a part of the cathode rod located in the anode cylinder has a burr.

In some embodiments, the bottom of the cathode rod is provided with a counterweight configured to maintain the cathode rod to be vertically disposed.

In some embodiments, the anode cylinder has a regular prism structure, and the anode cylinder and the cathode rod are coaxially disposed.

In some embodiments, the bottom of the anode cylinder is provided with another counterweight configured to maintain the anode cylinder to be vertically disposed.

In some embodiments, the pulse power supply is identical to a pulse power supply used by the precipitator.

In some embodiments, the grounded current sampling unit includes three non-inductive resistors with an identical parameter, where the grounded end of the pulse power supply, the grounded end of the first pulse capacitor, and the anode cylinder are connected to the grounded point of the test site through one non-inductive resistor, respectively.

According to another aspect of the embodiments of the present invention, the apparatus for simulating spark discharge of a high-voltage electrostatic precipitator is used to carry out a simulation test, and a test method includes:

measuring a capacitance $C_1$ between the anode and the cathode of the precipitator and a capacitance $C_2$ between the cathode rod and the anode cylinder, respectively calculating, based on a quantity of precipitation tubes n of the precipitator and a capacitance $C_D$ of the voltage divider, a capacitance value of the first pulse capacitor and a capacitance value of the second pulse capacitor that are required for the test, and connecting the first pulse capacitor and the second pulse capacitor with the corresponding capacitance values to the apparatus for simulating spark discharge of the high-voltage electrostatic precipitator;

measuring a discharge signal by using an oscilloscope, where an output signal of the voltage divider and a voltage signal of two ends of the power grounded current sampling unit are connected to channels of the oscilloscope, respectively;

connecting the pulse power supply to a power supply, increasing an output voltage of the pulse power supply until spark discharge occurs, then decreasing the output voltage of the pulse power supply until spark discharge is terminated, and recording a voltage peak $U_1$ of the two ends of the grounded current sampling unit by using the oscilloscope;

setting a single rising edge trigger mode for the oscilloscope, adjusting a trigger voltage to $2U_1$, and then increasing the output voltage of the pulse power supply, so that when spark discharge occurs, the oscilloscope records a waveform u(t) of a voltage of the two ends of the grounded current sampling unit and a waveform $u_2(t)$ of a voltage output by the voltage divider;

performing conversion on the waveform u(t) of the voltage of the two ends of the grounded current sampling unit recorded by the oscilloscope to obtain a waveform i(t) of a current flowing through the grounded current sampling unit; and analyzing a characteristic of the discharge signal during the spark discharge based on the waveform $u_2(t)$ of the voltage output by the voltage divider and recorded by the oscilloscope and the waveform i(t) of the current of the grounded current sampling unit.

In some embodiments, the capacitance value of the first pulse capacitor is $C_{301}=C_1\times(n-1)/n-C_D$, and the capacitance value of the second pulse capacitor is $C_{302}=C_1/n-C_2$.

The present invention simulates spark discharge of the high-voltage electrostatic precipitator in a laboratory by using an equivalent capacitance. The test apparatus in the present invention is structurally simple, occupies small space, and facilitates measurement. In practice, anodes of various discharge tubes of the high-voltage electrostatic precipitator are in close contact, which makes it difficult to perform measurement separately. In the present invention, two pulse capacitors are disposed to measure and analyze discharge energy output by the precipitation tube on which spark discharge occurs, a tube precipitation tube without spark discharge, the pulse power supply, and other branches. In addition, the simulation test apparatus provided in the present invention can select, based on an actual situation, a corresponding pulse capacitor for equivalence, and can be applied to simulation of different types of high-voltage electrostatic precipitators. According to the test apparatus and the test method provided in the present invention, electrical characteristics of spark discharge of the high-voltage electrostatic precipitator can be further studied.

BRIEF DESCRIPTION OF THE DRAWINGS

In order to illustrate the technical solutions more clearly in the embodiments of the present invention, the accompanying drawings required for the embodiments will be briefly described below.

DETAILED DESCRIPTION OF THE EMBODIMENTS

An equivalent test model is constructed in a laboratory to realize equivalent electrical characteristics of an electrostatic precipitator. In this way, space required for a test can be reduced, and a monitoring point can be flexibly disposed based on an actual need, to facilitate in-depth research on discharge energy, a source, discharge current, and other characteristics of spark discharge of the precipitator.

Figure 1:
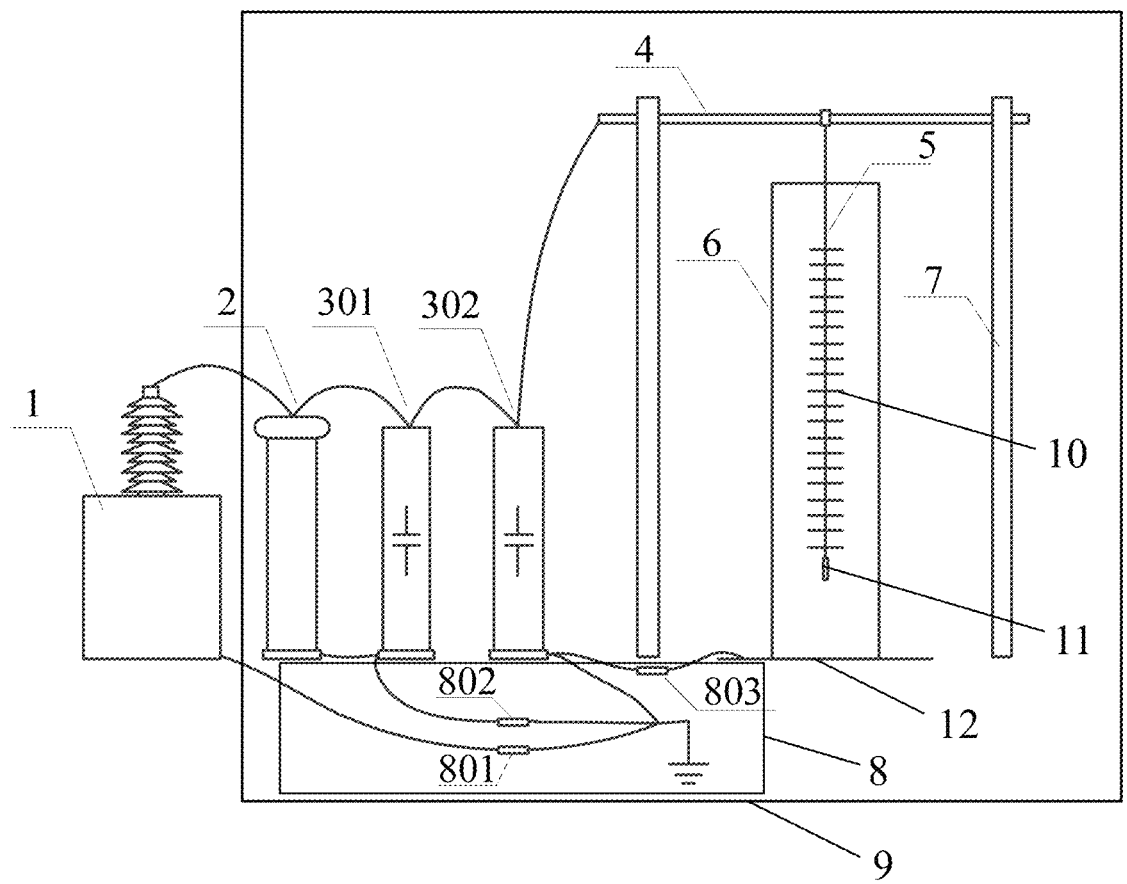
FIG. 1 is a schematic structural diagram of an apparatus for simulating spark discharge of a high-voltage electrostatic precipitator according to an embodiment of the present invention.
Figure 2:
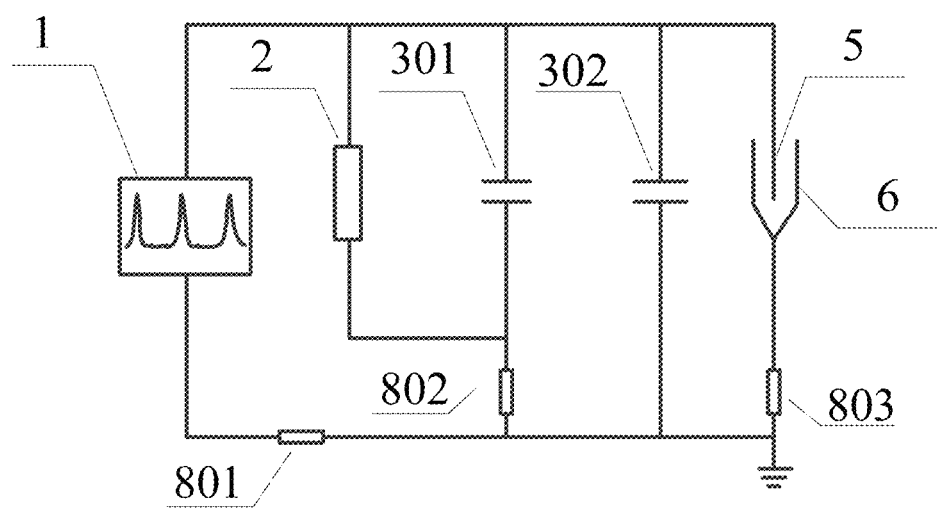
FIG. 2 is a schematic structural diagram of a circuit of an apparatus for simulating spark discharge of a high-voltage electrostatic precipitator according to an embodiment of the present invention.

As shown in FIG. 1 and FIG. 2, an apparatus for simulating spark discharge of a high-voltage electrostatic precipitator includes a pulse power supply 1 configured to provide a test voltage, a voltage divider 2 configured to measure an electrode voltage, a pulse capacitor unit configured to simulate an electrode capacitor of a precipitator, a cathode rod 5 configured to simulate a cathode of the precipitator, an anode cylinder 6 configured to simulate an anode of the precipitator, a metal bar configured to hang the cathode rod 5, an insulating support 7 configured to support the metal bar 4, and a grounded current sampling unit 8 configured to measure the grounded current.

The insulating support 7 is configured to support the metal bar 4 and the cathode rod 5 hung on the metal bar 4. The tops of left and right parts of the insulating support 7 are securely connected to two ends of the metal bar 4 respectively to form a door-shaped support structure. A hanging point is disposed in the middle of the metal bar 4 to hang the cathode rod 5. The cathode rod 5 is provided with a burr 10. When the cathode rod 5 is 1.6 m long, the burr 10 can be installed within 1 m of a lower part of the cathode rod 5. The bottom of the cathode rod 5 is provided with a counterweight 11 to ensure that the cathode rod 5 is vertically disposed. The cathode rod 5 is hung on the metal bar 4 and then extends into the anode cylinder 6. The burr 10 on the cathode rod 5 is located within the anode cylinder 6. The anode cylinder 6 has a regular prism structure, and another counterweight 12 is welded at the bottom to avoid dumping. The anode cylinder 6 and the cathode rod 5 are coaxially disposed.

The pulse power supply 1 is identical to a pulse power supply used by the precipitator, to ensure consistent power excitation between the simulation apparatus in the present invention and the precipitator. The pulse capacitor unit includes a first pulse capacitor 301 and a second pulse capacitor 302. The first pulse capacitor 301 is configured to simulate a precipitation tube on which spark discharge occurs in the precipitator, and the second pulse capacitor 302 is configured to simulate a capacitor of another precipitation tube connected in parallel to the precipitation tube on which spark discharge occurs.

The grounded current sampling unit 8 includes three non-inductive resistors 801, 802, and 803 with an identical parameter, and a resistance value may be 0.1Ω.

A high-voltage end of the pulse power supply 1, a high-voltage end of the voltage divider 2, a high-voltage end of the first pulse capacitor 301 and a high-voltage end of the second pulse capacitor 302 are successively connected, and then the high-voltage end of the second pulse capacitor 302 is connected to the metal bar 4.

A grounded end of the voltage divider 2 is connected to a grounded end of the first pulse capacitor 301 by using an insulated wire, the grounded end of the first pulse capacitor 301 is further connected to the non-inductive resistor 802 by using an insulated wire, and another end of the non-inductive resistor 802 is connected to a grounded point of test site 9 by using an insulated wire.

A grounded end of the second pulse capacitor 302 is connected to the grounded point of the test site 9 by using an insulated wire. The anode cylinder 6 is connected to the non-inductive resistor 803 by using an insulated wire, and another end of the non-inductive resistor 803 is connected to the grounded point of test site 9 by using an insulated wire.

In an example embodiment, a test method for simulating spark discharge of a high-voltage electrostatic precipitator is further provided, where a test is performed by using the above-mentioned apparatus for simulating spark discharge of a high-voltage electrostatic precipitator, and specific steps of the test are described below.

Step 1: Measure a capacitance $C_1$ between the anode and the cathode of the precipitator, and a capacitance $C_2$ between the cathode rod 5 and the anode cylinder 6; calculate, based on a quantity of precipitation tubes n of the precipitator and a capacitance $C_D$ of the voltage divider 2, a capacitance value of the first pulse capacitor 301 and a capacitance value of the second pulse capacitor 302 that are required for the test. A calculation method is as follows: The capacitance value of the first pulse capacitor 301 required for the test is $C_{301}=C_1 \times (n-1)/n - C_D$, and the capacitance value of the second pulse capacitor 302 required for the test is $C_{302}=C_1/n - C_2$.

Figure 3:
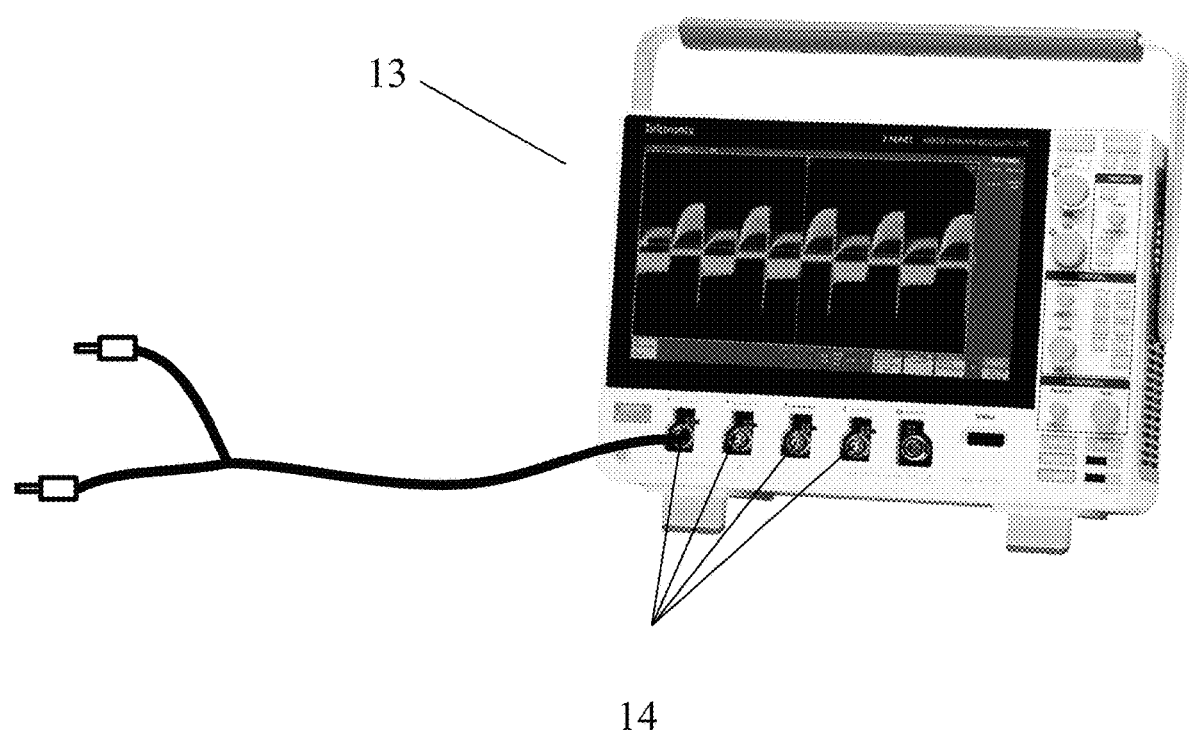
FIG. 3 is an oscilloscope with four channels.

Step 2: Connect the test loop based on a circuit shown in FIG. 2. A discharge signal is measured by using an oscilloscope 13, as shown in FIG. 3, with more than four channels, where an output signal of the voltage divider 2, a voltage signal of two ends of the non-inductive resistor 801, a voltage signal of two ends of the non-inductive resistor 802, and a voltage signal of two ends of the non-inductive resistor 803 are respectively connected to four channels 14 of the oscilloscope 13. The pulse power supply 1 is connected to a corresponding power supply.

Step 3: Based on the output signal of the voltage divider 2, adjust the pulse power supply 1, and increase an output voltage slowly until an obvious spark discharge sound is heard or a signal waveform in the oscilloscope 13 suddenly fluctuates greatly; then, decrease the output voltage of the pulse power supply 1 slowly until spark discharge is terminated, and record a voltage peak $U_1$ of the two ends of one non-inductive resistor by using the oscilloscope 13.

Step 4: Set a single trigger mode for the oscilloscope 13, and adjust a trigger voltage to $2U_1$; then, increase the output voltage of the pulse power supply 1, so that when spark discharge occurs, the oscilloscope 13 is triggered and records a waveform of the voltage output by the voltage divider 2 and a waveform of the voltage of the two ends of each of the non-inductive resistors 801, 802, and 803.

Step 5: Perform conversion on the waveform u(t) of the voltage of the two ends of each of the non-inductive resistors 801, 802, and 803 recorded by the oscilloscope 13 to obtain a waveform i(t) of the current flowing through each of the non-inductive resistors 801, 802, and 803, where a conversion relationship is: i(t)=2u(t).

Step 6: Analyze a characteristic of a discharge signal of each branch during the spark discharge based on the waveform $u_2(t)$ of the voltage output by the voltage divider 2 and recorded by the oscilloscope 13 and the waveform i(t) of the current of each of the non-inductive resistors 801, 802, and 803.

The present invention simulates characteristics of spark discharge of the precipitator under different load conditions. This is convenient for measurement, and is conducive to studying the characteristics and suppression measures of spark discharge of the high-voltage electrostatic precipitator.

What is claimed is:

1. An apparatus for simulating spark discharge of a high-voltage electrostatic precipitator, comprising:
a pulse power supply, configured to provide a test voltage;
a voltage divider, configured to measure an electrode voltage;
a pulse capacitor unit, comprising a first pulse capacitor and a second pulse capacitor;
a metal bar, transversely disposed on an insulating support;
a cathode rod, configured to simulate a cathode of the high-voltage electrostatic precipitator, wherein a first end of the cathode rod is connected to the metal bar, and a second end of the cathode rod is placed in an anode cylinder, wherein the anode cylinder is configured to simulate an anode of the high-voltage electrostatic precipitator; and
a grounded current sampling unit;
wherein, an end of the pulse power supply, an end of the voltage divider, an end of the first pulse capacitor and an end of the second pulse capacitor are successively connected, and then the end of the second pulse capacitor is connected to the metal bar; a grounded end of the voltage divider is connected to a grounded end of the first pulse capacitor; a grounded end of the pulse power supply, the grounded end of the first pulse capacitor and the anode cylinder are connected to a grounded point of a test site through the grounded current sampling unit; and a grounded end of the second pulse capacitor is connected to the grounded point of the test site.

2. The apparatus according to claim 1, wherein a part of the cathode rod is located in the anode cylinder and has a burr.

3. The apparatus according to claim 1, wherein a bottom of the cathode rod is provided with a counterweight, wherein the counterweight is configured to maintain the cathode rod to be vertically disposed.

4. The apparatus according to claim 1, wherein the anode cylinder has a regular prism structure, and the anode cylinder and the cathode rod are coaxially disposed.

5. The apparatus according to claim 1, wherein a bottom of the anode cylinder is provided with a counterweight, wherein the counterweight is configured to maintain the anode cylinder to be vertically disposed.

6. The apparatus according to claim 1, wherein the pulse power supply is identical to a pulse power supply used by the high-voltage electrostatic precipitator.

7. The apparatus according to claim 1, wherein the grounded current sampling unit comprises a first non-inductive resistor, a second non-inductive resistor and a third non-inductive resistor, wherein the first non-inductive resistor, the second non-inductive resistor and the third non-inductive resistor have an identical parameter; the grounded end of the pulse power supply is connected to the grounded point of the test site through the first non-inductive resistor; the grounded end of the first pulse capacitor is connected to the grounded point of the test site through the second non-inductive resistor; and the anode cylinder is connected to the grounded point of the test site through the third non-inductive resistor.

8. A test method for simulating spark discharge of a high-voltage electrostatic precipitator, wherein a simulation test is performed by using the apparatus according to claim 1, and the test method comprises:
measuring a capacitance $C_1$ between the anode and the cathode of the high-voltage electrostatic precipitator and a capacitance $C_2$ between the cathode rod and the anode cylinder, respectively calculating, based on a quantity of precipitation tubes n of the high-voltage electrostatic precipitator and a capacitance $C_D$ of the voltage divider, a first capacitance value of the first pulse capacitor and a second capacitance value of the second pulse capacitor, wherein the first capacitance value and the second capacitance value are required for the simulation test, and connecting the first pulse capacitor with a first calculated capacitance value and the second pulse capacitor with a second calculated capacitance value to the apparatus for simulating the spark discharge of the high-voltage electrostatic precipitator;

measuring a discharge signal by using an oscilloscope, wherein an output signal of the voltage divider and a voltage signal of two ends of the grounded current sampling unit are connected to channels of the oscilloscope, respectively;

connecting the pulse power supply to a power supply, increasing an output voltage of the pulse power supply until the spark discharge occurs, then decreasing the output voltage of the pulse power supply until the spark discharge is terminated, and recording a voltage peak $U_1$ of the two ends of the grounded current sampling unit by using the oscilloscope;

setting a single rising edge trigger mode for the oscilloscope, adjusting a trigger voltage to $2U_1$, and then increasing the output voltage of the pulse power supply, wherein when the spark discharge occurs, the oscilloscope records a waveform u(t) of a voltage of the two ends of the grounded current sampling unit and a waveform $u_2(t)$ of a voltage output by the voltage divider;

performing conversion on the waveform u(t) of the voltage of the two ends of the grounded current sampling unit recorded by the oscilloscope to obtain a waveform i(t) of a current flowing through the grounded current sampling unit; and analyzing a characteristic of the discharge signal during the spark discharge based on the waveform $u_2(t)$ of the voltage output by the voltage divider and recorded by the oscilloscope and the waveform i(t) of the current of the grounded current sampling unit.

9. The test method according to claim 8, wherein the first capacitance value of the first pulse capacitor is $C_{301}=C_1\times(n-1)/n-C_D$, and the second capacitance value of the second pulse capacitor is $C_{302}=C_1/n-C_2$.

10. The test method according to claim 8, wherein a part of the cathode rod is located in the anode cylinder and has a burr.

11. The test method according to claim 8, wherein a bottom of the cathode rod is provided with a counterweight, wherein the counterweight is configured to maintain the cathode rod to be vertically disposed.

12. The test method according to claim 8, wherein the anode cylinder has a regular prism structure, and the anode cylinder and the cathode rod are coaxially disposed.

13. The test method according to claim 8, wherein a bottom of the anode cylinder is provided with a counterweight, wherein the counterweight is configured to maintain the anode cylinder to be vertically disposed.

14. The test method according to claim 8, wherein the pulse power supply is identical to a pulse power supply used by the high-voltage electrostatic precipitator.

15. The test method according to claim 8, wherein the grounded current sampling unit comprises a first non-inductive resistor, a second non-inductive resistor and a third non-inductive resistor, wherein the first non-inductive resistor, the second non-inductive resistor and the third non-inductive resistor have an identical parameter; the grounded end of the pulse power supply is connected to the grounded point of the test site through the first non-inductive resistor; the grounded end of the first pulse capacitor is connected to the grounded point of the test site through the second non-inductive resistor; and the anode cylinder is connected to the grounded point of the test site through the third non-inductive resistor.

* * * * *